(12) United States Patent
Heiland (10) Patent No.: US 8,256,735 B2
(45) Date of Patent: Sep. 4, 2012

(54) SUPPORTING DEVICE FOR SUPPORTING VIBRATION SENSITIVE COMPONENTS

(75) Inventor: Peter Heiland, Raunheim (DE)

(73) Assignee: Integrated Dynamics Engineering GmbH (DE)

( * ) Notice: Subject to any disclaimer, the term of this patent is extended or adjusted under 35 U.S.C. 154(b) by 975 days.

(21) Appl. No.: 11/457,582

(22) Filed: Jul. 14, 2006

(65) Prior Publication Data

US 2007/0052946 A1    Mar. 8, 2007

(30) Foreign Application Priority Data

Jul. 16, 2005  (EP) .................................... 05015497

(51) Int. Cl.
*F16M 1/00* (2006.01)
(52) U.S. Cl. ............. 248/638; 267/293; 108/20; 269/20
(58) Field of Classification Search .................. 248/636, 248/638, 901, 562, 580, 581, 654; 108/20, 108/147; 269/20, 35; 267/64.11, 64.27, 267/64.23, 140.5, 64.25, 64.28
See application file for complete search history.

(56) References Cited

U.S. PATENT DOCUMENTS

| | | | |
|---|---|---|---|
| 3,989,232 A * | 11/1976 | Steinbach et al. ............. 267/117 |
| 4,599,834 A * | 7/1986 | Fujimoto et al. ............. 52/167.8 |
| 5,793,598 A * | 8/1998 | Watanabe et al. ............. 361/144 |
| 6,408,767 B1 | 6/2002 | Binnard et al. |
| 2003/0155882 A1 * | 8/2003 | Ono et al. ...................... 318/649 |
| 2004/0135979 A1 * | 7/2004 | Hazelton ......................... 355/51 |
| 2004/0137384 A1 * | 7/2004 | Hara ............................ 430/434 |
| 2005/0140961 A1 | 6/2005 | Yanagisawa et al. |

FOREIGN PATENT DOCUMENTS

| | | |
|---|---|---|
| EP | 1137054 A1 | 9/2001 |
| EP | 1811526 A1 | 7/2007 |
| JP | 9072125 A | 3/1997 |
| WO | 2005024266 A1 | 3/2005 |
| WO | 2006052855 A | 5/2006 |

OTHER PUBLICATIONS

Wiebo Van Toledo, "EP Application No. 05 015 497.0 Office Action", Jan. 19, 2010, Publisher: EPO, Published in: EP.
Youichi Tokoromura, "Japanese Office Action for Application No. 2006-193740", Jan. 25, 2010, Publisher: Japanese Patent Office.
"European Office Action for European International Application No. EP 05 015 497.0", Dated: Apr. 14, 2011, Publisher: European Patent Office, Published in: EP.
"English Translation of JP_9072125".

* cited by examiner

*Primary Examiner* — Kimberly Wood
(74) *Attorney, Agent, or Firm* — Kaplan Breyer Schwarz & Ottesen LLP (57) ABSTRACT

The invention is in particular a supporting device for relative supporting loads with respect to a base comprising a load side part, a base side part, and an intermediate part giving support to the load side part, and thus defining a supporting direction with reference to the base and the load side, including a pressure chamber bounded by chamber walls.

9 Claims, 6 Drawing Sheets

SUPPORTING DEVICE FOR SUPPORTING VIBRATION SENSITIVE COMPONENTS

FIELD OF THE INVENTION

The present invention relates to a supporting device for relative supporting loads with respect to a base, a load carrying assembly for carrying vibration sensitive devices, a metrology tool, and a lithographic tool.

BACKGROUND OF THE INVENTION

On a general basis lithographic/metrology tools always comprise a base frame and a payload. The base frame is fastened to the floor or platform. The payload is a frame that supports the vibration sensitive components such as stages, beams, lenses, and measurement devices. Supporting devices are often located between the base frame and the payload. Insofar, generally, the supporting devices have at least a double functionality. They on the one side support the payload and on the other isolate it from vibrations. Vibrations of the base frame are caused by all kind of lithographic/metrology device self induced forces, such as stage reaction forces, acoustics, material-handling systems, tubes, and pumps. Since the base frame is placed on a floor or platform, vibration will also arise in the base under influence of vibrations present in the floor.

Such a lithographic device with the respective supporting devices is, for example, known from the U.S. Pat. No. 6,226,075.

The lithography device disclosed therein comprises a supporting device provided with a first part, a second part, and a gas spring for supporting the second part relative to the first part parallel to a support direction. The gas spring comprises a pressure chamber, which is provided in an intermediate part and is bounded by a piston which is displaceable in the intermediate part parallel to the support direction and is supported perpendicularly to the support direction by means of a static gas bearing. The stiffness of the supporting device parallel to the support direction is thus substantially entirely determined by the stiffness of the gas spring.

The supporting device of the known kind has the following disadvantages:

It is an open gas system, which is not leakage free. The static gas bearings need a continuous gas flow from the air supply unit.

This system needs to have ultra fine (<0.003 um) particle filter in order to overcome contamination of wafers and other contamination sensitive parts in the lithographic/metrology tool.

Without major changes on the known system, it is not usable in a vacuum application The used gas bearings require high accurate parts (tolerances app. +/−1 μm)

Gas bearings are very sensitive for contamination.

SUMMARY OF THE INVENTION

These and other disadvantages of the state of the art supporting devices have lead to the primary object of the present invention to provide a supporting devices, which in particular has a simplified and reliable construction that can be used without problems in a vacuum environment but nevertheless provides a stiffness that is as low as possible in a direction parallel to the support direction and perpendicular to the support direction.

It is another object of the present invention to provide a lithographic or metrology tool in which a mass spring system formed by the supporting devices and by the frame with the components of a load carrying assembly and a lithographic or metrology tool, respectively, supported thereby has natural frequencies which are as low as possible in direction parallel to the supporting and perpendicular to the support direction.

Thus far, in general, the invention is in particular a supporting device for relative supporting loads with respect to a base comprising a load side part, a base side part, and an intermediate part giving support to the load side part, and thus defining a supporting direction with reference to the base and the load side, including a pressure chamber bounded by chamber walls, wherein the chamber walls include at least a part, which is provided to be deformable parallel to the support direction that is adapted to be substantially undeformable perpendicular to the support direction, and bendable about two perpendicular axis orthogonal to the support direction, and which is located closer to the base side part than to the load side part.

By means of the inventive supporting device, highly advantageously, a flexible pressure chamber is provided, which fulfills all the needs required to prevent a transmission of vibrations from the base to the load side part in the direction parallel to the support direction. The isolation character or stiffness parallel to the support direction of the inventive supporting device is straight forwardly determined by the fluid, which is preferably a compressible medium like a gas, e.g. air, and its pressure inside the pressure chamber, and the flexibility or stiffness of that part of the chamber walls provided to be substantially deformable parallel to the support direction, being undeformable perpendicular to the support direction, and being bendable about two perpendicular axis orthogonal to the support direction.

Positively, the inventive supporting isolating device thus avoids any kind of gas bearings.

According to a further development of the invention the pressure chamber encompasses or consists of a communication pressure chamber having a first and a second end, whereby an upper pressure chamber is provided at the first end of the communication pressure chamber. This upper pressure chamber is located above the second end of the communication pressure chamber seen from the base side part in the supporting direction. Preferably, in that kind of embodiment the communication pressure chamber comprises the walls being deformable parallel to the support direction, being substantially undeformable perpendicular to the support direction, and being bendable about two perpendicular axis orthogonal to the support direction.

In addition to the upper pressure chamber the inventive pressure chamber could even further comprise a base pressure chamber provided at a second end of the communication pressure chamber, and in communicative connection with the communication pressure chamber. The provision of different chambers gives the inventive chamber a modular character, which allows the production of supporting devices according to the individual needs of different lithographic or metrology tools.

Further to the invention it is provided that the communication pressure chamber comprises a diaphragm-like structure, whereby in an astonishing simple and practical construction a metal diaphragm bellow can be used. With such a bellow a very robust system or supporting device can be provided, which is absolutely leakage free, and thus independent from any kind of gas or fluid supply. Another advantage is that metal bellows have defined or definable stiffness.

Favorably, the diaphragm bellow consists of diaphragm rings, which are edge welded together inside and outside. The bellow can be attached to the upper and base pressure chamber by means of a vacuum aluminum knife-edge seals, or by welding or any other kind of leakage free sealing.

A further development of the invention is provided in case when an extra, especially external, volume or chamber is connected to the pressure chamber or base chamber. Preferably, this external chamber could be optionally connected to the pressure chamber. The extra chamber substantially increases the total volume of the fluid pressure chamber. A possible fluid brought into the inventive pressure chamber might be an appropriate gas. Thus, the additional volume is a kind of gas buffer to control, and especially to lower, the stiffness of the gas spring. For to connect the pressure chamber with the extra volume, a supply line is provided through which the pressure chamber can be supplied with the extra fluid, e.g. gas. The supply line should have a sufficient large diameter (or cross-sectional surface, should be large enough) to prevent for so-called Helmholtz resonance frequencies between additional volume and base chamber.

A further supply line together with a suitable pressure supply could be provided supplying the pressure chamber e.g. with gas up to a defined pressure. Against the known system the supply line according to the inventive supporting device can be closed after the pressure chamber is fully filled by e.g. gas, so that the supporting device becomes insensitive for pressure supply variation. The inventive system is self-sufficient. Moreover, inherent gas flow noise from the supply line to the pressure chamber is prevented.

However, of course, the invention allows also other control strategies with other or deviating advantages, which will be apparent by what has been described herein after.

Insofar, the inventive supporting device shows an improved behavior in regard of prior art solutions even in case of a controlled and/or regulated pressure supply. This is because of the sealed character or closed nature of the volumes of the inventive supporting device resulting in a reduction of flow, and thus to limited pressure variations.

Therefore, it also lies within the scope of the invention to provide means for supplying pressure to the pressure chamber that encapsulates the fluid. Being able to change the pressure inside the supporting device has the advantage that the supporting device can be easily adapted to different payloads. Moreover, since a pressure change, changes also the hovering height of the payload any need of forces of Lorenz force actuators, which, as will be described herein below, can be attached to the inventive supporting device to compensate specific static forces, can be limited.

Depending on the needs varies kind of pressure supply means are applicable according to the invention. In a conventional concept for example for low weight and low pressure, e.g. pressures in the range of 0 to 8 bar, ordinary pressure generating and regulating means, like normal servo valves, can be used. Additionally, to further control the fluid or gas pressure, a restriction can be implemented into the supply line supplying to the pressure chamber.

Moreover, in cases for instance, if the payload to be supported is too large, or if the size requirements are such that the area of the supporting device is too small, more sophisticated means for fine controlling the pressure inside the pressure chamber of the inventive supporting device can be applied according to the invention. Insofar, it is part of the inventive concept to provide means for converting the pressure from low to high pressure. It is the purpose of that means to boost the pressure to provide high pressure for a strongly loaded pressure chamber. According to the invention, such a pressure booster comprises a high and a low pressure side, whereby the low pressure side can be easily regulated by conventional pressure regulating valves. Thus, means are provided by which a payload can be effectively kept on micro-meter stable height with sufficient accuracy.

In this regard the invention further comprises an embodiment of an inventive pressure generating means in such that a pressure supply chamber is provided encompassing a volume, and means for reducing the volume of the chamber. Within the pressure supply chamber high pressure is provided. The pressure supply chamber is connect via a line to the pressure chamber of the supporting device. In a possible further refinement of the pressure supply chamber, a small opening is provided, which guides a plunger into the volume of the pressure supply chamber. The plunger is thus able to move into the pressure supply chamber volume to reduce the volume compressing the fluid inside the chamber resulting in an increase of pressure in the pressure supply chamber and the pressure chamber, or can move out of the pressure supply chamber volume to decrease the pressure. In its movement, the plunger can be controlled by control means, e.g. a servo system.

The inventive supporting device advantageously also comprises a connection member connecting the load part of the supporting device with the upper pressure chamber. According to the invention the connection member is adapted to be undeformable parallel to the support direction, and bendable about two perpendicular axis orthogonal to the supporting direction. For that purpose for example an elastic hinge made of metal and steel, respectively, can be used. This is a particular simple and practical construction, and thus goes along with the over all advantageously robust design of the inventive supporting device.

The use of the elastic hinge prevents a transmission of rotational vibrations of the upper pressure chamber about axis of rotation, which are perpendicular to the support direction, and since the pressure chamber and the upper pressure chamber, respectively is furthermore mechanically connected via the edge welded bellow and the base chamber with the base plate, the elastic hinge prevents a transmission of rotational vibration of the base plate about axis of rotation, which are perpendicular to the support direction.

Moreover, advantageously, the stiffness perpendicular to the support direction can be especially well determined by the rotational stiffness of both the connection member and the flexible chamber walls about two perpendicular axis orthogonal to the support direction, and the distance between these two pivot points in the direction parallel to the support direction, and the weight of the payload together with the one-dimensional springs that acts perpendicular to the support direction (see below).

Further to control or to optimize the stiffness in the direction parallel to the support direction or the natural frequency of the inventive supporting device, it is advantageously provided to link the pressure chamber with a negative stiffness module. Such a module is disclosed by the European Patent Application EP 1 359 341 A2 which is hereby incorporated by reference. Preferably, the negative stiffness device or module is parallel linked or connected to the pressure chamber in the direction parallel to the support direction. The bottom side of the negative stiffness device is connected to the base side part of the supporting device while the top side of the negative stiffness device is connected to the top side part of the supporting device. Preferably the stiffness of the pressure chamber acts along the same axis, parallel to the support direction, as the negative stiffness of the negative stiffness device, such that no rotational stiffness is introduced.

With regard to another embodiment of the invention, it is provided that the inventive supporting device comprises, preferably a pair of Lorenz actuators or motors on each inventive supporting apparatus, so that if three supporting apparatus are used a total of minimum six Lorenz motors are applied. The Lorenz motors are supposed to act in particular in supporting direction and in the direction perpendicular to the support direction. Of course, if more motor force is needed, additional motors can be placed that act parallel to the both described motors. Since Lorenz motors are contact-less, such Lorenz motors do not transmit any vibration from the base part to the top part. Lorenz actuators can serve to prevent or restrict displacements, rotations, and pivoting movements.

To this end, and especially in the above described case if the pressure supply line is closed and if system is self-sufficient, together with the Lorenz actuator the invention provides a control on additional static forces applied to the inventive supporting device and/or on changes of fluid or gas temperatures inside the pressure chamber and/or changes of the environmental pressure acting on the payload. During normal operation, when the supporting device prevents the transmission of vibration in all directions and rotations of the base part to the load part, the Lorenz motor will handle disturbance forces, like for example acoustic forces, parasitic forces which origin from cables, and residual forces of stages. Yet, on those occasions, when the vertical control force consists of a static part, or quasi static part with frequencies smaller than 0.002 Hz, or between 0.01 to 0.001 Hz, in deviation of what has been described herein before, gas will be let in or out in very small gas quantities and over long period of time (two minutes or longer). Because only very small quantities are let in/out over a long time period this will not introduce any additional (self induced) vibrations to a payload other than a very low frequent i.e. quasi static change of the relative position between a payload and a base in the direction parallel to the support direction. As a result the energy dissipation due to a static direct current is prevented as much as possible.

The above described control strategy for static forces could for example be realized by two parallel control loops. The first control loop is using the Lorenz motors and the second parallel loop is using a pressure valve, which is capable to control the pressure in the pressure chamber. The static gain of the Lorenz control loop is limited and much lower than the static gain of the pressure loop that is working in parallel. In theory the static gain of the pressure loop is infinite since a pure integral action is used in the quasi-static frequency area. As a result the pressure loop always takes over the static force from the Lorenz motors and thus preventing for energy dissipation.

It should be noted that in the case of the usages of a more open system with a pressure valve as described herein before. In general the height/pressure control at DC up to 0.1 Hz is done by servo valves. In this control action an integrating action is applied. Thus, the pneumatics deals with the static and very low disturbances, whereas the Lorenz actuators in the support direction handle the low frequent to intermediate frequent disturbances. In this configuration the DC (direct current) constant part of the forces is automatically removed from the Lorenz actuators.

According to a further development of the invention additional positive stiffness is provided to the inventive system (consisting of at least three inventive devices) by means of at least three one-dimensional springs acting on the load side part perpendicular to the supporting direction and acting with respect to each other in such a way that all three lateral degrees of freedom are covered, for example having a 120 degrees angle between each other. Favorably, each supporting device comprises two of these one-dimensional springs, which act in perpendicular direction of each other. Advantageously, the stiffness of these springs can be easily adjusted. Moreover, favorably the one-dimensional springs have a very low stiffness in all other five degrees of freedom. A practical location of these one-dimensional springs is parallel to the load side part, i.e. perpendicular to the supporting direction. Advantageously, these one-dimensional springs can be used to optimize the stiffness and the natural frequency in the direction perpendicular to the support direction.

The above and other objects and advantages of the invention will become apparent from the following specifications, drawings, and claims. It will be understood that particular embodiments of the invention are shown by way of illustration only and not as limitation of the invention. The principle features of the invention may be employed in various embodiments without departing from the scope of the invention.

DETAILED DESCRIPTION

Figure 1:
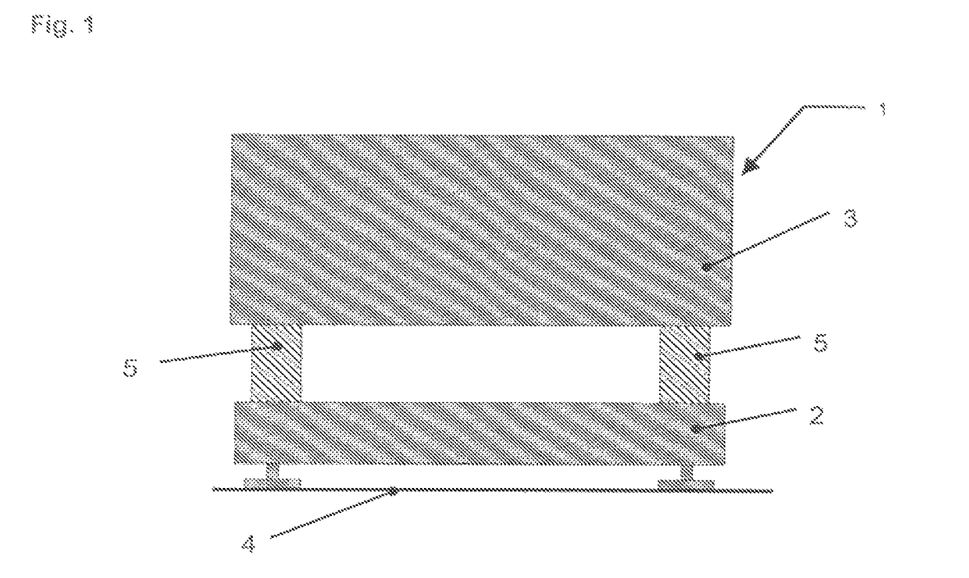
FIG. 1 is a cross-sectional view of a basic layout of a lithographic/metrology device according to the invention.

FIG. 1 shows a basic layout of a lithographic/metrology device 1. Such a tool 1 always comprises a base frame 2 and a payload 3. The base frame 2 is fastened to the floor 4. The payload 3 is a frame that supports the vibration sensitive components (not shown) such as stages, beams, lenses, and measurement devices. The supporting devices 5 are located between the base frame 2 and the payload 3. They support the payload in vertical and lateral directions. The minimum number of supporting devices 5 is three. However, other basic layout configurations are also possible where the base frame 2 is fastened to a platform that is connected via some kind of supporting devices to the floor 4. For vacuum applications the supporting devices 5 can be placed in a vacuum chamber (not shown).

Vibrations of the base frame 2 are caused by all kind of lithographic/metrology device self induced forces, such as stage reaction forces, acoustics, material-handling systems, and pumps. Since the base frame 2 is placed on a floor or platform 4, vibration will also arise in the base frame 2 under influence of vibrations present in the floor 4. A transmission of the vibrations present in the base frame 2 through the supporting devices 5 into the payload 3 must be prevented as much as possible during operation because the payload 3 supports the vibration sensitive components, and because very stringent requirements on the vibration accuracy of these components. The supporting devices 5 are for this purpose provided with means, to be described in more detail further below, for preventing a transmission of vibration from the base frame into the Payload.

Figure 2A:
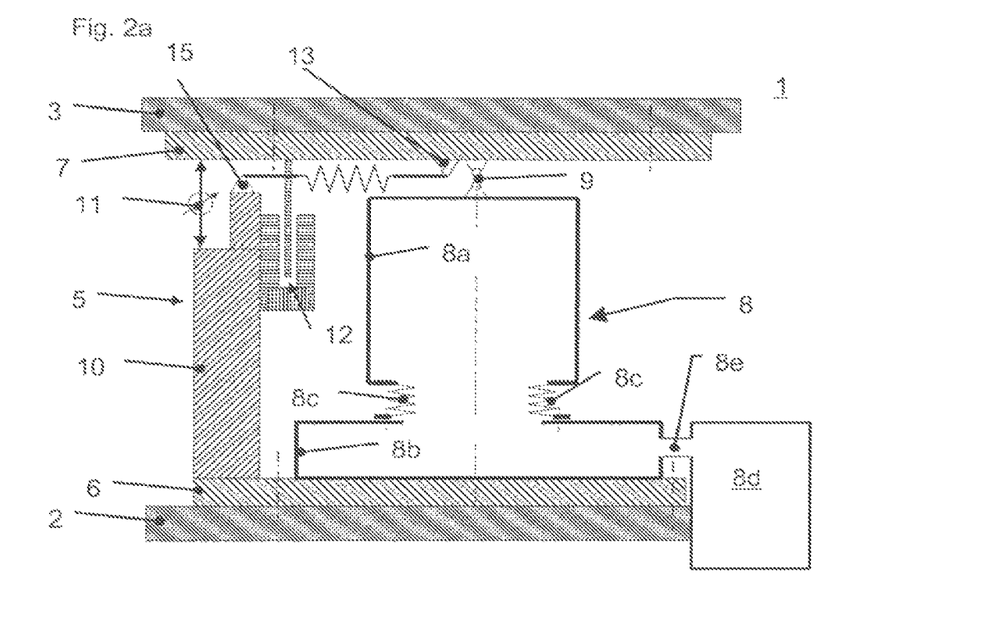
FIG. 2a is a schematic cross-sectional view showing the essential parts of the inventive supporting device suitable for use in lithographic/metrology device of FIG. 1.
Figure 2B:
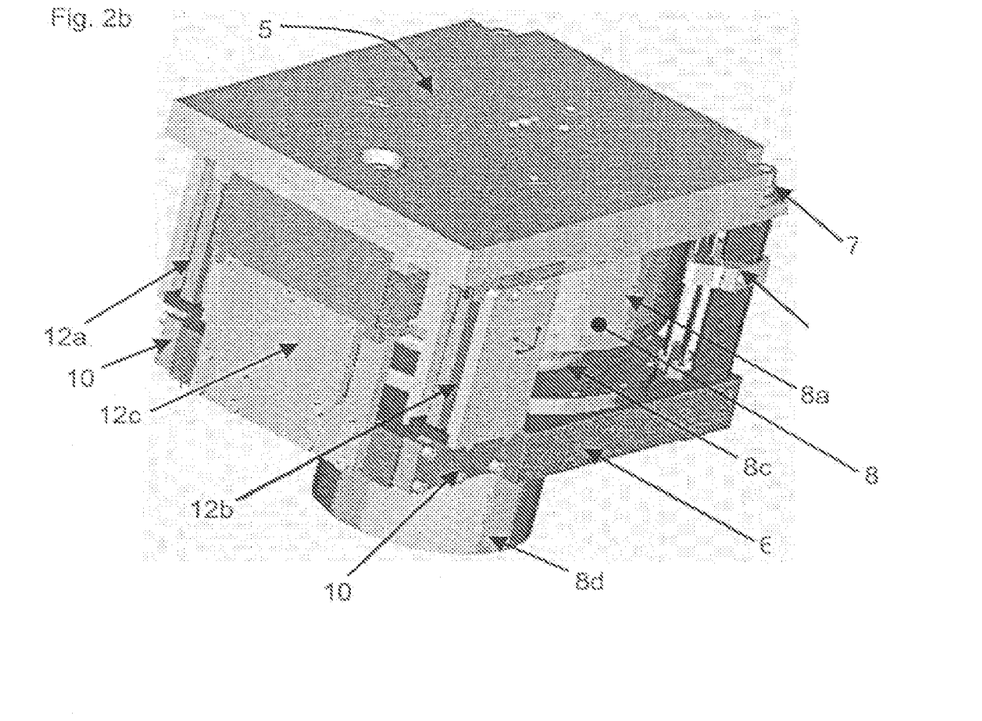
FIG. 2b is a perspective view of the inventive supporting device according to FIG. 2a suitable for use in lithographic/metrology device of FIG. 1.

FIG. 2a is a diagrammatic cross-sectional view of the supporting device 5 according to the invention for use in a lithographic or metrology device 1, whereas FIG. 2b displays a perspective view of the inventive supporting device. Both Figs show a first part 6, called base plate which can be fasted to the base frame 2 (not shown in FIG. 2b, see FIG. 1 or 2a) of the lithographical/metrology device, a second part, called Top Plate 7, which can be fastened to the Payload 3 (not shown in FIG. 2b see FIG. 1 or 2a) of the lithographic/metrology device 1.

The supporting device of FIGS. 2a and 2b has a gas spring 8 supporting the top-plate 7 relative to the base plate 6 by means of a supporting force, which is, directed parallel to the vertical support direction.

The gas spring 8 comprises a pressure chamber 8 in which a comparatively high gas pressure is present during operation. The pressure chamber 8 being bounded by chamber walls consists of a first or upper chamber 8a or main volume 8a, a communication chamber 8c or edge welded bellow 8c, and a second or base chamber 8b or base volume 8b (not shown in FIG. 2b see FIG. 2a) and an optional additional volume 8d.

The main volume 8a could be of different cross-sections. For instance, it could be rectangular or round in cross-section, as it is displayed in FIG. 2b. On the bottom side of the main volume 8a the edge welded bellow 8c is mounted via a leakage free sealing. The bottom side of the edge welded bellow 8c is mounted via a leakage free sealing to the Base Volume 8b (not shown in FIG. 2b). An optional additional volume 8d is in communication with the base volume 8b via a connection line 8e (not shown in FIG. 2b). The connection line 8e should have a sufficient large diameter (or cross-sectional surface, should be large enough) to prevent for so-called Helmholtz resonance frequencies between additional volume 8d and base volume 8c.

The use of additional volume 8d substantially increases the volume of the gas spring 8, so that the stiffness of the gas spring 8 parallel to the support direction is lowered.

The edge welded bellow 8c preferably is made of metal. The edge welded bellow 8c mechanical stiffness parallel to the support direction is relatively small and very linear in the range of the base frame 2 vibration amplitudes. The edges welded bellow 8c is substantially undeformable perpendicular to the support direction and is capable of bending about two mutually perpendicular bending axis, which are perpendicular to the support direction. The metal bellow 8c has the advantage of having known stiffness characteristics in all directions that are typically significantly less than the stiffness characteristics of, for example, rubber diaphragms. This allows the design of isolation systems with natural frequencies of less than 1 Hz for payloads of less than 3,000 kg at operating pressures of less than 6 bar. The edge welded bellow 8c is a particular simple and practical construction, however other devices that are leakage free, that are substantially undeformable perpendicular to the support direction and are capable of bending about two mutually perpendicular bending axes, which are perpendicular to the support direction, can also be used. Of course, it is obvious for a person skilled in the art that the described embodiment is only an example of varies possible embodiments according to the invention. Thus, it is clear that e.g. depending on the seize of bellow 8c higher or lower pressures might be needed. With a different bellow operating with 8 bar and 0.7 Hz for instance a weight of about 6600 kg can be carried.

The supporting device 5 according to the invention has a stiffness which, as seen parallel to the support direction, is determined by the stiffness of the gas spring 8 and by a mechanical stiffness of the edge welded bellow 8c. As a result, the mass spring system in the lithographic/metrology device 1 according to the invention, formed by the supporting device 5 according to the invention used therein and by the payload 3 with the sensitive components of the lithographic/metrology device 1 supported thereby, has a low natural frequency in the directions parallel to the support direction, so that the transmission of vibrations in the directions parallel to the support direction from the base frame 2 to the payload 3 is prevented as much as possible.

Figure 3:
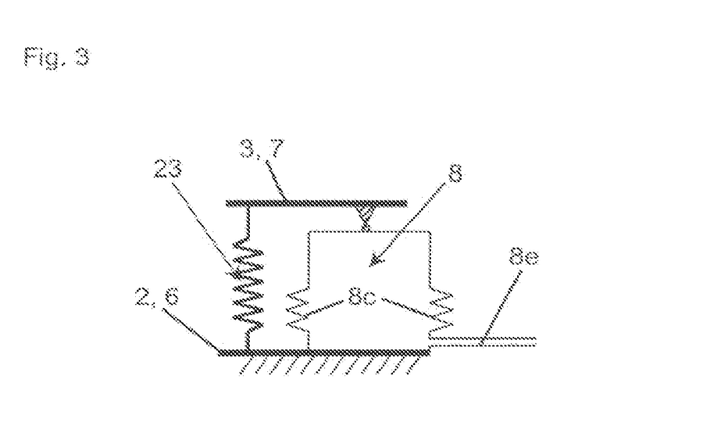
FIG. 3 is a schematic view showing the inventive supporting device in parallel to a spring supporting the payload.

However, if at wish, it is possible to achieve a stiffness of the supporting device 5 parallel to the support direction, which is even lower than the already described one, if the gas spring 8 and the edge welded bellow 8c are suitably combined, preferably in parallel with an appropriate negative stiffness module to reduce the stiffness. Schematically, this is shown in FIG. 3, wherein spring/negative stiffness module 23 is parallel coupled with gas spring 8 and edge welded bellow 8c. An applicable negative stiffness module is disclosed within the European Patent Application EP 1 359 341 A2 which is hereby incorporated by reference. Consequently, according to the invention, a lithographic/metrology device 1 with natural frequencies as low as possible could be designed. Thus the transmission of vibrations in the directions parallel to the support direction from the base frame 2 to the payload 3 is prevented as much as possible.

However, just as can been added a negative stiffness module to the gas spring 8 to remove/reduce the stiffness of bellow 8c and gas spring 8, we can also add a positive spring 23 to the inventive supporting device. The latter is slightly pressure related, because by adding next to the gas spring 8, which is also supporting the payload 3, the needed pressure needed within the gas spring 8 can be limited. The additional spring 23 can be a coil spring or leaf spring from any suited material. A part of the load 3 is carried by the additional spring 23 and another part is carried by the gas spring 8. By carefully selecting the type of spring, initial length and other properties the weight can be distributed such that the pressure inside the gas spring 8 is in a suitable range. This spring element 23, as shown in FIG. 3, is connected in parallel to the air volume of gas spring 8. The stiffness and load carrying capacity of the spring 8 is chosen such that the natural frequency of the total system, including for instance a negative stiffness module, is low enough to obtain the needed isolation performance.

With regard to FIG. 2a, it can be seen that the supporting device 5 according to the invention is fastened to the top plate 7 by means of connection member called elastic hinge 9. This elastic hinge 9 is substantially undeformable parallel to the support direction and is capable of bending about two mutually perpendicular bending axis which are perpendicular to the support direction. The use of the elastic hinge 9 prevents a transmission of rotational vibrations of the main volume part 8a about axis of rotation, which are perpendicular to the support direction. The main volume 8a is furthermore mechanically connected via the edge welded bellow 8c, the base volume 8b with the base plate 6. As a result the elastic hinge 9 prevents a transmission of rotational vibration of the base plate 6 about axis of rotation, which are perpendicular to the support direction. Preferably, the elastic hinge 9 is made of steel. Such kind of hinge 9 is a particular simple and practical construction; however other devices that are substantially undeformable parallel to the support direction and are capable of bending about two mutually perpendicular bending axes, which are parallel to the support direction, can also be used.

The embodiment with reference to FIG. 2a or 2b comprises a pair of support members 10 (FIG. 2b), and three Lorenz motors or actuators 12 (12a, 12b, 12c, FIG. 2b), and a pair of position sensors 11 (not shown in FIG. 2b) measuring in horizontal and vertical direction. Within FIG. 2a, due to its perspective and its schematic character the actuators are generally denoted 12. FIG. 2b displays all three actuator. Two are horizontal motors 12a, 12b, i.e. act in horizontal direction and one is a vertical motor 12c, i.e. acts in vertical direction. Depending on the forces expected sometimes the use of for example two motors acting both in the same direction (e.g. perpendicular to the support direction) and also two motors parallel to the support direction might be appropriate. It has been proven that the minimum number of motors 12 per supporting device 5 should be two, and that a practical maximum number is probably around eight. These actuators 12 in one supporting device are allowed to work in more than two directions. However, in the minimum case with two actuators in each supporting device the actuator should work in parallel with the support direction and perpendicular to the support direction. With three actuators one can choose to mount them all perpendicular to each other where one is working in the support direction.

Since Lorenz motors 12 are contact-less, such Lorenz motors do not transmit any vibration from the base plate 6 to the top plate 7. Lorenz actuators 12 of the supporting devices can serve to prevent or restrict displacements, rotations, and pivoting movements of the payload relative to the base frame. Lorenz like motors are for example disclosed by U.S. Pat. No. 4,796,873, which is hereby incorporated by reference. The Lorenz motors are used to compensate all forces accept long term DC (direct current) forces over a long time period, in case a long term DC force occurs special valves will let in/out very small gas quantities over a very long time period. This issue is subject of a separate section further in the description.

The provision of a Lorenz actuator 12 makes the inventive supporting device adaptive to changes with regard to additional forces on the payload.

For filling up the pressure chamber 8, the inventive supporting device can be connected to a compressor via a communication or gas supply line (both not shown in FIG. 2). After the pressure chamber 8 is fully filled by gas, the supply line is closed, so that the supporting device 1 becomes insensitive for pressure supply variation. Also inherent gas flow noise from the supply line to the pressure chamber is prevented.

During normal operation, when the supporting device prevents the transmission of vibration in all direction and rotations of the base plate to the payload, the Lorenz motors 12 will compensate for disturbances forces, like acoustic noise and all kind of residual forces from stages and other motors. As soon as the Lorenz motor force consist of a static part (direct current through the motor coil) gas will be let in or out in very small gas quantities over a long period of time (2 min or more). Because very small quantities are let in/out over a long time period this will not introduce any additional (self induced) vibrations of the payload other than a very low frequent say quasi static change of the relative position between payload and base frame in the direction parallel to the support direction. As a result the energy dissipation due to a direct current through the Lorenz motors is prevented as much as possible.

Figure 4A:
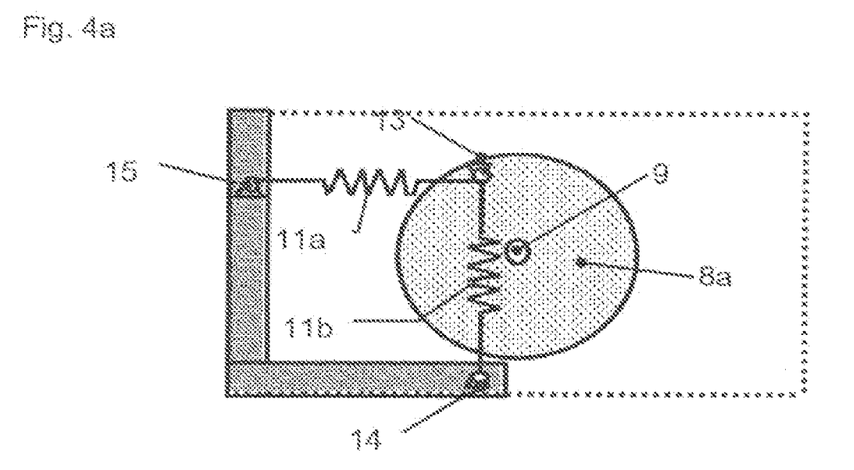
FIG. 4a is a diagrammatic top view of the inventive supporting device after removal of the top plate.
Figure 4B:
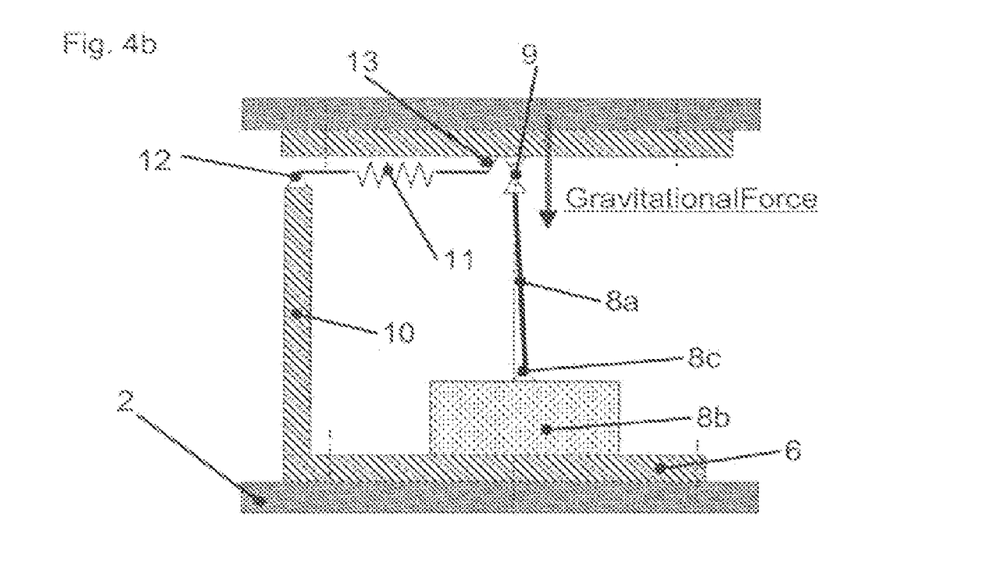
FIG. 4b is a diagrammatic side view of the inventive lithographic/metrology device displaying the inverted pendulum effect as part of the inventive lithographic/metrology device assembly

Now reference is made to FIGS. 4a and 4b in connection with FIG. 2. FIG. 4a shows a top view of the inventive supporting device 5 after having removed the top plate 7. FIG. 4b is schematic a cross-sectional side view of the embodiment according to FIG. 2. Therein, the main volume 8a has been drawn to be a straight line indicating the fact that the main volume 8a forms an inverted pendulum with respect to the Elastic hinge 9, and the joint 8c formed by the edge welded bellow 8c. For clarity reasons the stiffness of the gas spring and the stiffness of the communication pressure chamber both acting parallel to the support direction, not included in this drawing 4b. Both the edge welded bellow 8c and the elastic hinge 9 are capable of bending about two mutually perpendicular bending axes, which are perpendicular to the support direction. The main volume 8a is represented in FIG. 4b as a part that is substantially undeformable in all directions.

Without gravitational forces the stiffness between top plate 7 and base plate 6 in the directions perpendicular to the support direction will be small and will have positive sign. The gravitational force results in a negative stiffness between top plate 7 and base plate 6 in the directions perpendicular to the support direction. This negative stiffness can be calculated by multiplying the payload mass by the gravitational acceleration, thereafter this answer is divided by the distance in supporting direction between the joint of the elastic hinge 9 and the joint made by the edge welded bellow 8c. For practical values the overall stiffness between top plate 7 and base plate 9 in the directions perpendicular to the support direction will be negative.

The negative stiffness can be compensated by two one-dimensional springs 11a, 11b acting in perpendicular direction of each other. Each one-dimensional spring 11a, 11b does have an adjustable stiffness in the direction perpendicular to the supporting direction and have a very low stiffness in all other five degrees of freedom. Each one-dimensional spring is placed between the top plate 7 and the support members 10 in the direction perpendicular to the support direction. The connection points of the one-dimensional springs 11a, 11b are joints 13, 14, 15 that are substantial undeformable in the direction of the adjustable spring stiffness of the one-dimensional spring. A practical location of these one-dimensional springs is parallel to the top plate 7 sketched in FIG. 4b. The two one-dimensional springs 11a, 11b may also be rotated about an axis parallel to the support direction as long as they are acting mutually perpendicular to each other, and perpendicular to the support direction. The overall stiffness in the directions perpendicular to the support direction will be positive because the negative inverted pendulum stiffness is compensated by the two one-dimensional springs.

Figure 4C:
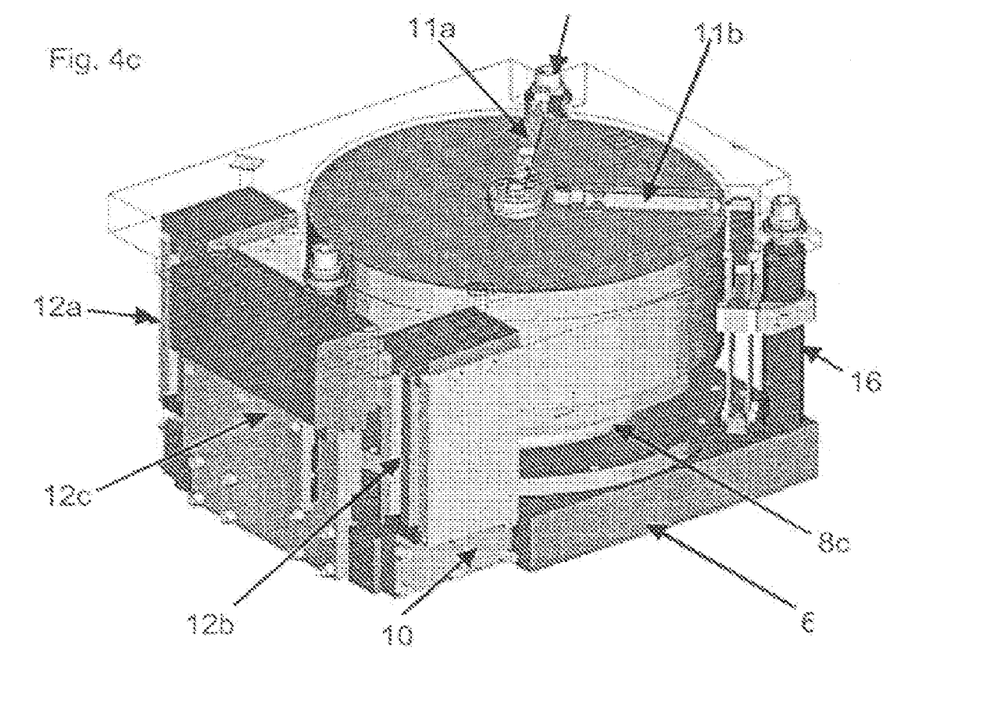
FIG. 4c is an elevational view of the inventive supporting device of FIG. 2b showing a one dimensional spring assembly.

FIG. 4c illustrates an elevation view of FIG. 2b (The top plate is made transparent for clarity reasons). From that Fig, in a less schematic way, again the placement and the fixation of the one-dimensional springs 11a and 11b within the inventive supporting device 5 can be seen. Both springs 11a, 11b are attached to adjustment rods 16 at the corners of the base plate 6 opposite to the Lorenz motors 12. Moreover, they are fixed at points on top of gas spring 8, near by hinge 9.

Figure 5:
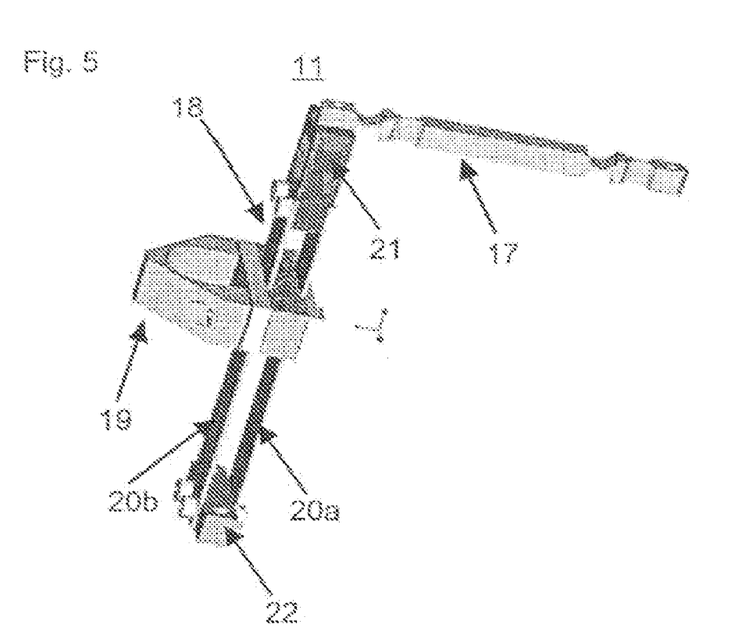
FIG. 5 is a perspective view of a one-dimensional spring applied within the inventive supporting device.

As can be seen from FIG. 5 the inventive springs 11 (11a, 11b) consist of essentially three parts: A flexure part 17, a leaf spring part 18, and an adjustment member 19 for affixing the spring to the adjustment rod 16. The flexure part 17 is chosen to be very stiff in the direction perpendicular to the supporting direction. The leaf spring part comprises two leaf springs 20a, 20b parallel to each other. The leaf springs are screwed together by a first connection member 21 and a second connection member 22. The second connection member can be fixed to base plate 6, and gives thus, in the built-in state of spring 11 (11a, 11b), further support. The first connection member 21 connects flexure part 17 to leaf spring part 18, such that these parts are right angled to each other. Adjustment member 19 connects the leaf springs 20a, 20b with adjustment rod 16. It is a kind of clamp, which sandwiches the leaf springs 20a, 20b and embraces the adjustment rod 16, thereby defining a bending point for the leaf springs 20a, 20b and the length of the leave springs 20a, 20b between adjustment member 19 and first connection member 21. Thus, the stiffness of the leaf springs 20a, 20b and that of the spring 11 can be adjusted by moving the adjustment member 19 over rod 16.

When incorporated in the inventive supporting device the flexure arms or parts 17a and 17b are located at right angle to each other parallel to the top surface and perpendicular to the supporting direction, respectively. Vice versa the leaf spring part 18 goes along the supporting direction.

An alternative method of compensating the negative stiffness of the inverted pendulum perpendicular to the support direction can be provided if three or more supporting devices are used in a system setup refer to FIG. 1. With three one-dimensional springs as described above it is possible to compensate the negative stiffness.

As a result, the mass spring system in the lithographic/metrology device according to the invention, formed by the supporting device according to the invention used therein and by the payload with the sensitive components of the lithographic/metrology device supported thereby, has a very low natural frequency in the directions perpendicular to the support direction, so that the transmission of vibrations in the directions perpendicular to the support direction from the base frame to the payload is prevented as much as possible. Furthermore the natural frequency in the directions perpendicular to the support direction is adjustable by the two one-dimensional spring stiffness in the direction perpendicular to the support direction.

Figure 6A:
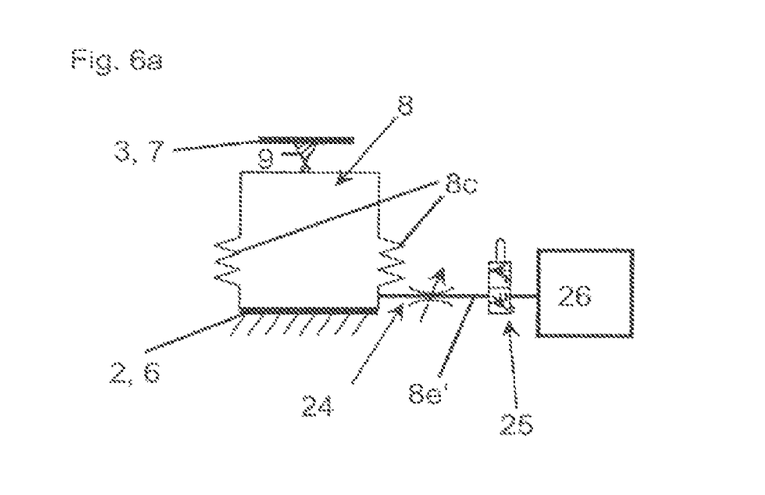
FIG. 6a is a diagrammatic side view of the connection of the inventive supporting device with a pressure supply.

FIG. 6a displays the inventive gas spring 8 being connected to a pressure supply device 26 via a pressure regulating servo valve 25 through a restriction 24 via connection line 8e'. Thus, restriction 24, within connection line 8e', is located between gas spring 8 and servo valve 25 in series with gas spring 8, servo valve 25 and pressure supply 26. Pressure supply 26 is provided for supplying the gas spring 8 with pressurized gas or any kind of appropriate fluid. These elements could also be connected to the additional air volume 8d according to FIG. 2a.

The pressure inside the gas spring 8 times the cross-sectional area of the gas spring 8 gives the supporting force of each supporting device 5 (see FIGS. 1 and 5). If we change the pressure by means of the servo valve 25 there will be a small volume flow in or out the gas spring 8/supporting devices 5 through the restriction 24 due to the small pressure changes. This will change the hovering height of the payload 3 on top of top plate 7 (see FIG. 2a). This reduces the needed forces of the Lorenz force actuators 12 (see FIGS. 2a, 2b) that are also attached to the inventive supporting devices.

Due to the closed nature of the inventive supporting device 5 or gas spring 8 including the edge welded bellow 8c (FIG. 2a), the inventive supporting device is far less sensitive to pressure changes than prior art systems The set up described in the paragraphs just before is appropriate to be use—depending on servo valves applied—for pressures from 0 to 8 bar by means of control voltages of 0 to 10 Volt. However there might be applications, for which this is not sufficient. This can be the case when the mass of the system to be supported is too large or when the size requirements are such that the area of the supporting device becomes too small. The usual high-pressure regulation techniques would not provide for the required accuracy to keep the load on a μm stable height. Therefore, the invention encompasses also a fine control of the pressure or volume to get optimal position stability. To this end, two embodiments, which are shown in FIGS. 6b and 6c, are described hereinafter.

Figure 6B:
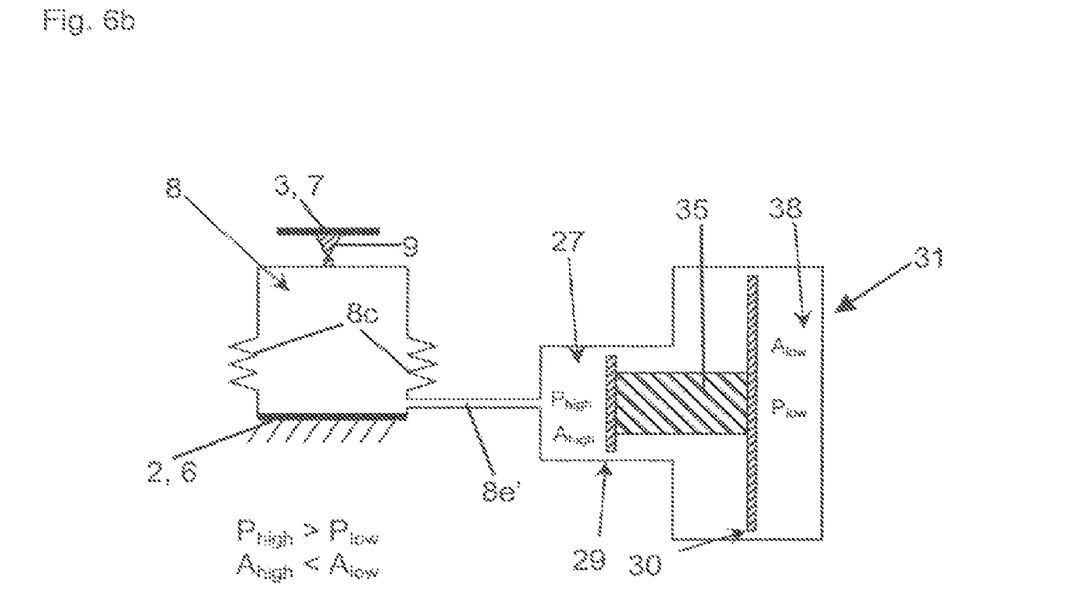
FIG. 6b is a diagrammatic side view of the inventive supporting device being connected with a pressure booster.

FIG. 6b depicts a pressure booster 31 that can be put between gas spring 8 and pressure regulating valve 25 as described in connection with FIG. 6a. The pressure booster consists of a small plunger 29 at one side and at the other side a big plunger 30. In between is a suited uncompressible medium, like hydraulic oil or a rigid connection 35. The side with the big plunger 30 is the low-pressure side 27. The side with the small plunger 29 is the high-pressure side 27. The pressure at the low-pressure side can be controlled with a normal pressure regulator mentioned as described in connection with FIG. 6a. Due to the difference in area there will be a magnification of the pressure between the low pressure 28 and the high-pressure side 27. In this way the pressure can be controlled very accurate at very high pressure levels up to 20 bar and more. The seal and guidance of the plungers 29, 30 can be done by means of bellows. These elements can withstand the (high) pressure, have no friction so give a very fine and linear control and prevent all leakage from the high and the low-pressure side of the pressure booster.

Figure 6C:
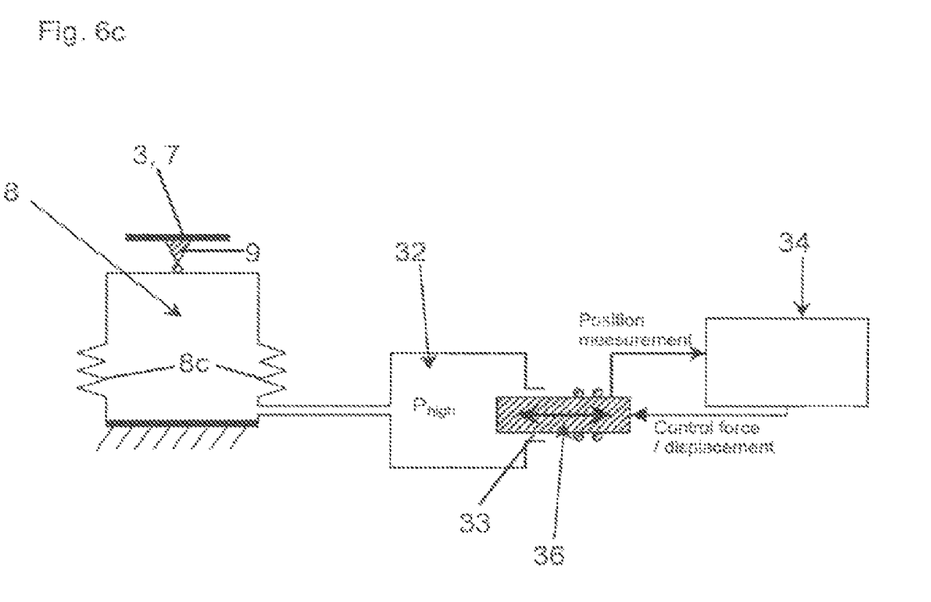
FIG. 6c is a diagrammatic side view of the inventive supporting device being connect with an inventive pressure supply chamber.

FIG. 6c shows an alternative regarding a fine control especially on high pressures. According to FIG. 6c a pressure supply chamber or volume 32 is provided. The pressure supply chamber has an opening 36, in which a plunger 33 is at least partially guided. When the plunger, which has a small area in respect to the other elements, is moved into volume 32 the total volume, of the inventive supporting device 5 and gas spring 8, respectively, will be changed. By keeping the area of the plunger 33 small a very small volume change is achieved if the plunger 33 is moved a small amount. The plunger 33 can be controlled with any servo system. A rack and pinion and a rotary motor (not shown in FIG. 6c), which is under close loop control by controller 34 is suited. Just as a linear actuator such as a long stroke Lorenz actuator will be able to control this. The control signal to the position controller of the plunger will control the volume of the pressure supply chamber 8 and the supporting device and so the height of the payload 3 (see FIGS. 1 and 2a). The plunger 36 could be sealed and guided by an edge-welded bellow (not shown in FIG. 6c). This will prevent friction during movement and leakage of the system.

What is claimed is:

1. A supporting device for relative supporting lithography or metrology tools with respect to a base comprising:
    a load side part,
    a base side part, and
    an intermediate part giving support to the load side part, and thus defining a support direction with reference to the base side part and the load side part,
    wherein the intermediate part includes a pressure chamber that is formed by chamber walls to encapsulate a fluid,
    wherein the chamber walls include a bellow that is deformable in the support direction, and undeformable perpendicular to the support direction, and is located closer to the base side part than to the load side part, and wherein the load side part is connected with the pressure chamber by an elastic hinge that is stiff in the support direction and bendable perpendicular to the support direction.

2. The supporting device as claimed in claim 1, wherein said bellow separates said pressure chamber into an upper pressure chamber and a communication pressure chamber.

3. The supporting device as claimed in claim 1, wherein the pressure chamber further comprises a base pressure chamber communicatively connected to a communication pressure chamber.

4. The supporting device as claimed in claim 1, wherein said bellow comprises diaphragm rings that are edge welded together inside and outside.

5. The supporting device as claimed in claim 4, wherein the diaphragm rings are made of metal.

6. The supporting device as claimed in claim 1, wherein said pressure chamber comprises or is line-connected to an additional reservoir.

7. The supporting device as claimed in claim 1, wherein said elastic hinge is made of metal.

8. The supporting device as claimed in claim 1, wherein the supporting device comprises at least one one-dimensional spring acting on said load side part perpendicular to the supporting direction.

9. The supporting device as claimed in claim 1, wherein the supporting device further comprises a pair of Lorenz actuator.

* * * * *